(12) United States Patent
Deml et al.

(10) Patent No.: US 7,274,595 B2
(45) Date of Patent: Sep. 25, 2007

(54) NONVOLATILE MEMORY DEVICE FOR STORING DATA AND METHOD FOR ERASING OR PROGRAMMING THE SAME

(75) Inventors: Christoph Deml, München (DE); Thomas Liebermann, München (DE)

(73) Assignee: Infineon Technologies AG, Munich (DE)

( * ) Notice: Subject to any disclaimer, the term of this patent is extended or adjusted under 35 U.S.C. 154(b) by 46 days.

(21) Appl. No.: 11/318,865

(22) Filed: Dec. 27, 2005

(65) Prior Publication Data

US 2006/0203566 A1    Sep. 14, 2006

(30) Foreign Application Priority Data

Dec. 27, 2004   (DE) ...................... 10 2004 063 641

(51) Int. Cl.
  *G11C 11/34*   (2006.01)
  *G11C 16/04*   (2006.01)
(52) U.S. Cl. .............................. 365/185.12; 365/185.21
(58) Field of Classification Search ........... 365/185.12, 365/185.21, 207
  See application file for complete search history.

(56) References Cited

U.S. PATENT DOCUMENTS

| | | | |
|---|---|---|---|
| 5,465,235 A | 11/1995 | Miyamoto | 365/203 |
| 6,304,486 B1 * | 10/2001 | Yano | 385/185.22 |
| 6,798,697 B2 * | 9/2004 | Hosono et al. | 365/185.12 |
| 6,826,082 B2 * | 11/2004 | Hwang et al. | 365/185.17 |
| 2006/0268608 A1 * | 11/2006 | Noguchi et al. | 365/185.09 |

\* cited by examiner

*Primary Examiner*—Anh Phung
(74) *Attorney, Agent, or Firm*—Eschweiler & Associates, LLC

(57) ABSTRACT

A method for erasing or programming a nonvolatile memory device comprising a memory cell, a sense amplifier, and a page memory, the method comprising the steps of: performing an erasure or programming operation in a manner dependent on the data stored in the page memory, reading out the content of the erased or programmed memory cells, modifying the content of the page memory in a manner dependent on the data read out, and performing a further erasure or programming operation in a manner dependent on the modified data, and the data read out from the erased or programmed memory cell being fed to the page memory, and the content of the page memory being modified in a manner solely dependent on these data and control signals controlling the temporal sequence.

12 Claims, 4 Drawing Sheets

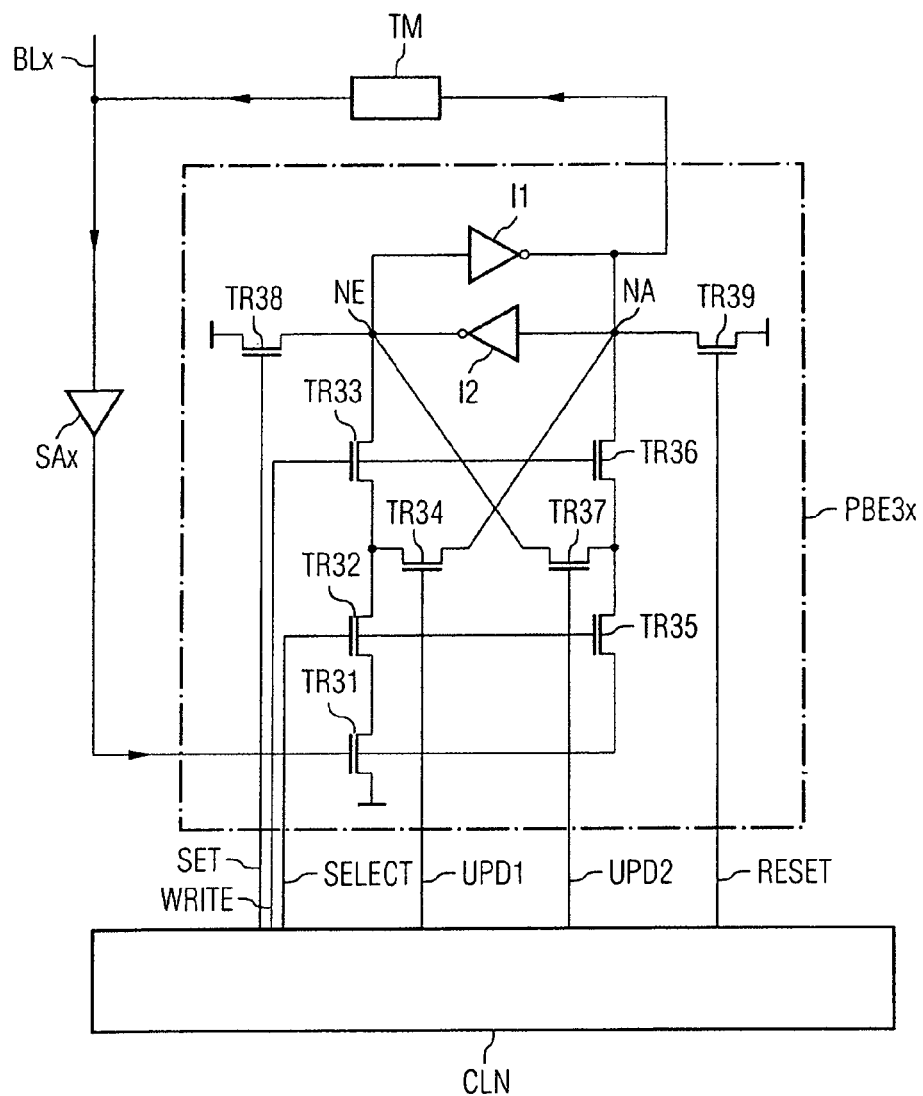

NONVOLATILE MEMORY DEVICE FOR STORING DATA AND METHOD FOR ERASING OR PROGRAMMING THE SAME

PRIORITY

This application claims priority from German Patent Application No. DE 10 2004 063 641.9, which was filed on Dec. 27, 2004, and is incorporated herein by reference in its entirety.

TECHNICAL FIELD

The present invention relates to a method for erasing or programming a nonvolatile memory device for storing data and to a nonvolatile memory device for storing data.

BACKGROUND

The basic construction of a nonvolatile memory device is illustrated in FIG. 1.

The memory device shown in FIG. 1 is a flash memory, and contains a memory cell array SZF having a multiplicity of memory cells which are arranged in a multiplicity of rows and in a multiplicity of columns, each of the memory cells being performed by a memory transistor and being designed for storing a single bit.

The memory cell array SZF contains n memory cell columns SS1 to SSn and m memory cell rows SR1 to SR4, where n and m are greater than or equal to 1.

The memory transistors are designated by the reference symbols T11 to Tnm and each have a gate section with a gate terminal G, a drain section with a drain terminal D, a source section with a source terminal S, and a floating gate FG. The construction and the method of operation of such memory transistors are known, so that a more detailed description thereof can be dispensed with.

The source terminals S of the memory transistors of each memory cell column SS are in each case connected via a source line SL1, SL2, . . . , SLn to ground or any other voltage; for the sake of completeness, it should be noted that of the source lines SL1, SL2, . . . , SLn present, a plurality or all of the source lines can be connected to one another. The drain terminals D of the memory transistors of each memory cell column SS are in each case connected to one another via a bit line BL1, BL2, . . . BLn. The gate terminals G of the memory transistors of each memory cell row SR are in each case connected to one another via word lines WL1, WL2 . . . WLm.

Furthermore, the arrangement shown in FIG. 1 contains a sense amplifier SA1, SA2, . . . SAn per bit line, the sense amplifier SA1 being connected to the bit line BL1 on the input side, the sense amplifier SA2 being connected to the bit line BL2 on the input side, . . . , and the sense amplifier SAn being connected to the bit line BLn on the input side. For the sake of completeness, it should be pointed out that provision may also be made of fewer sense amplifiers, for example only half as many sense amplifiers, and the sense amplifiers present may alternately be connected to different bit lines via multiplexers or the like.

Flash memories furthermore generally contain a page memory, in which the data that are to be written simultaneously to the flash memory are buffer-stored. Furthermore, a control device which controls the erasure, programming and read-out of the flash memory is generally provided. The page memory and the control device are not illustrated in FIG. 1.

The level of the bit stored in a memory cell depends on the charge state of the floating gate FG of the memory transistor forming the relevant memory cell. Said charge state, to put it more precisely the quantity of free electrons present in the floating gate, can be altered by erasure or programming of the relevant memory cell and does not alter or alters at most to an extremely small extent after the erasure or programming. Dependent on the charge state of the floating gate is the threshold voltage of the relevant memory transistor, that is to say the difference between the voltage applied to the source terminal and the voltage applied to the gate terminal, from which the memory transistor undergoes transition from the off state to the on state or from the on state to the off state.

During the erasure and programming of a memory cell, the memory transistor forming the relevant memory cell is driven by application of corresponding voltages to the gate terminal, the source terminal and the drain terminal in such a way that the number of free electrons present in the floating gate of the memory transistor is increased or reduced. To put it more precisely, voltages applied to the gate terminal, the source terminal and the drain terminal are such that electrons present in the floating gate migrate to the source section via an insulating layer present between the floating gate and the source section, or that electrons migrate from the source section to the floating gate via the insulating layer. The specific way in which this occurs is known and does not require more detailed explanation.

In the example under consideration, as a result of the erasure of a memory cell, the number of electrons present in the floating gate is reduced, and the level of the bit stored in an erased memory cell is defined as 0. It should be apparent and needs no explanation that there is not any restriction to this. It is also possible for the number of electrons present in the floating gate to be increased as a result of the erasure of a memory cell. Independently of how the memory cell is erased, it is also possible, of course, to define the level of the bit stored in an erased memory cell as 1.

The programming of a memory cell is carried out in such a way that the opposite procedures take place. That is to say, in the example under consideration, the number of electrons present in the floating gate is increased as a result of the programming of a memory cell. If the number of electrons present in the floating gate is increased as a result of the erasure of a memory cell, the number of electrons present in the floating gate is reduced as a result of the programming of this memory cell. The level of the bit stored in a programmed memory cell is defined complimentarily with respect to the level of the bit stored in an erased memory cell.

For the sake of completeness, it should be noted in this connection that a memory cell of a flash memory, as a result of it being programmed, can only be brought to a state which is complementary to the erased state of the memory cell. That is to say, in the case of flash memories, as a result of a programming, either a bit having the value 1 can only be written to a memory cell storing a bit having the value 0, or a bit having the value 0 can only be written to a memory cell storing a bit having the value 1. In relation to the example presently under consideration, in which the erased memory cells in each case store a bit having the value 0, this means that, as a result of the programming, it is only possible for a bit having the value 1 to be written to a memory cell storing a bit having the value 0. By contrast, in the example under consideration it is not possible to write a bit having the value 0 to a memory cell storing a bit having the value 1 by programming. If, in the example under consideration, a bit having the value 0 is intended to be written to a memory cell storing a bit having the value 1, this can only be effected by erasing the relevant memory cell. This is the reason why flash memories are generally erased prior to programming.

If the content of a memory transistor is intended to be read out, specific voltages are applied to this memory transistor via the word line, the bit line and the source line to which it is connected, and the current flowing via the relevant bit line is determined, the content of the memory cell formed by the memory transistor being evident from the current flowing via the bit line. The currents flowing via the assigned bit lines BL1 to BLn during the read-out from memory cells are evaluated by the sense amplifiers SA1 to SAn.

The voltages which are applied during the read-out of a memory cell to the memory transistor forming this memory cell, to put it more precisely to the gate terminal, the source terminal and the drain terminal of this transistor, are dimensioned such that the memory transistor is thereby put into the on state if it is erased, and that it remains turned off if it is programmed (or vice versa).

The way in which a memory cell has to be driven during erasure, programming and read-out is known and does not require more detailed explanation.

The memory cell array is generally subdivided into a multiplicity of pages, each page comprising a multiplicity of memory-cells. In the example under consideration, a page is formed by a memory cell row. However, provision could also be made for each page to comprise only part of a memory cell row. It is also possible for a page to comprise only a single memory cell. Independently of this it is also possible for the memory cell array to comprise only a single page.

The memory cell array is programmed page by page. That is to say that all the memory cells of a page can in each case be programmed simultaneously. Which memory cells of a page are actually programmed in each case depends, however, on the data to be written to the memory cells.

The erasure and read-out of the memory cells may likewise be effected page by page, but this is less likely to be the case. Usually, the memory cells that can be read simultaneously and the memory cells that can be erased simultaneously are not identical with the memory cells of one page and can be defined independently of one another.

In order that, during the read-out of a memory cell, a correct decision can be made as to whether the bit stored therein has the level 0 or the level 1, the threshold voltages of the erased memory transistors and the threshold voltages of the programmed memory transistors must differ distinctly from one another. As has already been mentioned above, the threshold voltage of a memory transistor is the difference between the voltage applied to the source terminal and the voltage applied to the gate terminal, from which the memory transistor undergoes transition from the off state to the on state or from the on state to the off state. As has likewise already been mentioned above, the threshold voltage depends, inter alia, on the number of free electrons present in the floating gate. The number of electrons present in the floating gate in turn may be altered by erasure or by programming of the memory transistor. However, it is not the case that all erased memory transistors and all programmed memory transistors each have the same threshold voltage. This is illustrated in FIG. 2.

FIG. 2 shows how many memory cells of a memory device having a multiplicity of memory cells have what threshold voltage. The threshold voltages present are distributed between two ranges, namely a first range B1, which lies between a threshold voltage VT1 and a threshold voltage VT2, and a second range B2, which lies above a threshold voltage VT3, in which case it holds true that VT3>VT2>VT1, and VT1>0.

The threshold voltages of the erased memory transistors lie in the first range B1, and the threshold voltages of the programmed memory transistors lie in the second range B2.

The third range B3 lying between the first range B1 and the second range B2 is a forbidden range in which no threshold voltages are permitted. The difference between the source voltage and the gate voltage which are applied to the respective memory transistors during the read-out thereof lies in said range B3. The use of source and gate voltages having a difference that lies in the range B3 has the effect that the erased memory transistors and the non-erased memory transistors behave differently during the read-out thereof. To put it more precisely, it is the case that the erased memory transistors are in the on state during the read-out thereof, whereas the programmed memory transistors are in the off state during the read-out thereof. The consequence of this is that a relatively large current flows via the bit lines connected to erased memory transistors during the read-out thereof, and that a smaller current or no current flows via the bit lines connected to programmed memory transistors during the read-out thereof. The sense amplifiers SA1 to SAn already mentioned above detect the currents flowing via the bit lines during read-out and can unequivocally ascertain on the basis of the magnitude of these currents whether the memory transistors read are erased or programmed memory transistors.

In order for this to function reliably under all circumstances, the third range B3 must be as large as possible. That is to say that the threshold voltage of that memory transistor which has the highest threshold voltage among the erased memory transistors should be as small as possible, and the threshold voltage of that memory transistor which has the smallest threshold voltage among the programmed memory transistors should be as large as possible. On the other hand, however, it is the case that the threshold voltages of the erased memory transistors are not permitted to be too small either. They are not permitted to fall below a specific known lower limit, because otherwise the memory transistor enters into the normally on state and, consequently, would supply a current contribution during the read-out of a memory cell situated in the same column but in a different row, which may lead to an incorrect read-out of the memory cell to be read. Independently of this, it is furthermore the case that the ranges B1 and B2 are also not permitted to be separated too much from one another, because otherwise it would be necessary to work with particularly high voltages during erasure and during programming of the memory transistors, or every erasure or programming of a memory transistor would have to encompass a plurality of erasure or programming operations.

One possibility for ensuring that programmed memory transistors are reliably identified as programmed during the read-out thereof consists in a programming verification being carried out directly after the programming of a page, which programming verification involves checking whether the programmed memory cells were programmed properly (sufficiently intensely) and by reprogramming those memory transistors which were not programmed properly (not programmed sufficiently intensely) by the programming.

An apparatus that can be used to realize this is shown in FIG. 3.

The arrangement shown in FIG. 3 contains a memory cell array SZF, a multiplicity of sense amplifiers, of which only a single sense amplifier SAx is illustrated for the sake of clarity, a page memory PB, and a control device CL, the control device containing a write data memory WDM, a multiplicity of combination devices, of which only a single combination device CMx is illustrated for the sake of clarity, and a series of further components, which are not shown in FIG. 3, however.

In the example under consideration, the memory cell array SZF is the memory cell array SZF shown in FIG. 1 and described with reference thereto.

The sense amplifiers correspond to the sense amplifiers SA1 to SAn of the arrangement shown in FIG. 1. In the example under consideration, the number of sense amplifiers is equal to the number of memory cells per page. To put it more precisely, each of the memory cells that can be written to and can be erased simultaneously is assigned a dedicated sense amplifier.

The write data memory WDM and the page memory PB serve for buffer-storing the data to be written to the memory cell array SZF and each have a number of memory elements corresponding to the number of memory cells per page. Each memory cell of a page is assigned a dedicated memory element of the write data memory WDM.

The data to be written to the memory cell array are written to the page memory PB before data are written to the memory cell array SZF by the control device CL. The content of the page memory PB can furthermore be modified by the combination devices CM. For this purpose, the page memory PB is connected to the output terminals of the combination devices on the input side. Furthermore, the page memory PB is connected to the bit lines on the output side. Via this connection, the bit line voltage required for programming or non-programming is applied to the bit lines during the programming of the memory cells connected thereto. In this case, the fact of whether the bit line voltage required for programming is applied to the bit line or the bit line voltage required for non-programming is applied to the bit line depends on the data stored in the page memory PB.

In the example under consideration, the number of combination devices CM is likewise equal to the number of memory cells per page. To put it more precisely, each sense amplifier is assigned a dedicated combination device.

Each combination device has two input terminals and an output terminal. Of the input terminals, one input terminal in each case is connected to the output terminal of the assigned sense amplifier. The other input terminal is connected to the memory element of the write data memory WDM which stores the data bit which is to be written to the memory cell which is read by the sense amplifier assigned to the combination device. The output terminal of each combination device is connected to the page memory PB. To put it more precisely, each combination device is connected to the memory element of the page memory PB which stores the data bit which is to be written to the memory cell which is read by the sense amplifier assigned to the combination device. The data output by the combination device are written to the page memory PB. The function and the operating procedure of the combination devices emerge from the following description of the programming of the memory cell array SZF.

If a component of the system containing the memory cell array SZF would like to write data to the memory cell array, to put it more precisely would like to write to a page of the memory cell array, the relevant component communicates to the control device corresponding control commands and also the data to be written to the memory cell array and the address under which these data are to be stored.

The data to be written to the memory cell array are buffer-stored in the write data memory WDM and in the page memory PB. The control device CL then generally instigates firstly an erasure operation, which erases the memory cells of the page to which the new data are to be written. This has the effect that data bits having the value 0 are then stored in all the memory cells of the relevant page. Afterward, the data stored in the page memory PB are written to the page to be written to. In this case, the procedure is such that only those memory cells to which a data bit having the value 1 is intended to be written in accordance with the data stored in the page memory PB are programmed. For the remaining memory cells, that is to say for those memory cells to which a data bit having the value 0 is intended to be written in accordance with the data stored in the page memory PB, no action is performed which alters the charge state of the floating gate thereof.

A check is subsequently made to determine whether the data just written to the memory device match the data actually stored in the relevant memory cells. For this purpose, the memory cells of the page just written to are read, and the data read out are fed to the combination devices CM, which combine said data with the (desired) data stored in the write data memory WDM.

The combination devices CM carry out a combination of the data fed to them such that the output result is a data bit having the level 0,
if the memory cell read by the assigned sense amplifier SA should not be programmed (have the value 0 written to it), that is to say the data bit fed to the combination device CM from the write data memory WDM has the value 0, or if the memory cell read by the assigned sense amplifier SA should be programmed (have the value 1 written to it), and the programming was successful, that is to say if the data bit fed to the combination device CM from the write data memory WDM has the value 1 and the data bit read out by the assigned sense amplifier likewise has the value 1, and the output result is a data bit having the level 1,
if the memory cell read by the assigned sense amplifier should be programmed (have the value 1 written to it), and the programming was unsuccessful, that is to say if the data bit fed to the combination device CM from the write data memory WDM has the value 1 and the data bit read out by the assigned sense amplifier SA has the value 0, however.

The bits output by the combination devices CM are written to the page memory PB. Ideally, all zeros are then stored in the page memory PB. This would mean that the current content of the page written to previously matches the data to be written to said page and the programming operation can be terminated. If, on the other hand, one or more ones are stored in the page memory, this means that the programming of the page was unsuccessful, to put it more precisely that those memory cells of the memory cell array which are assigned the ones in the page memory were not written to properly. The programming operation is repeated in this case. Here, however, only those memory cells of the memory cell array which were not programmed successfully are reprogrammed.

An apparatus approximately corresponding to the arrangement shown in FIG. 3 is disclosed in EP 0 801 795 B1. Another possibility for identifying and handling programming errors is disclosed in EP 1 073 065 A1.

The reprogramming of the unsuccessfully programmed memory cells makes it possible for these memory cells also to be programmed properly. However, this advantage has to be bought at the cost of a very high additional outlay. In particular, it is necessary to provide a multiplicity of combination devices and a bus that connects the combination devices and the page memory. This has the effect that the arrangement shown in FIG. 3 is considerably larger and more expensive than an arrangement in which the programming is not checked and repeated. Furthermore, in particular the combinations carried out by the combination devices are very time-consuming, which leads to a not inconsiderable delay of the erasure or programming.

Corresponding problems also occur with other types of nonvolatile memory devices.

Furthermore, in the case of nonvolatile memory devices, the problem can also arise that memory cells to be erased were not erased properly.

SUMMARY

The present invention is therefore based on the object of developing a method and a memory device in such a way that it can be ensured in a simple manner that the erasure and/or the programming of a nonvolatile memory device can be carried out reliably without any errors under all circumstances.

This object can be achieved according to the invention by means of a method for erasing or programming a nonvolatile memory device for storing data comprising at least one memory cell, at least one sense amplifier for reading out the content of the at least one memory cell, and a page memory for buffer-storing data used as a basis for defining the driving of the at least one memory cell during the erasure or programming. The erasure or programming of a memory cell comprising the following steps of performing an erasure or programming operation in a manner dependent on the data stored in the page memory, reading out the content of the erased or programmed memory cells, modifying the content of the page memory in a manner dependent on the data read out, and performing a further erasure or programming operation in a manner dependent on the modified data, and the data read out from the erased or programmed memory cell being fed to the page memory, and the content of the page memory being modified in a manner solely dependent on these data and control signals controlling the temporal sequence.

When a memory cell to be programmed has not been programmed sufficiently intensely, single or multiple subsequent programming of this memory cell can be effected. When a memory cell to be erased has not been erased sufficiently intensely, single or multiple subsequent erasure of this memory cell can effected. When a memory cell to be erased has been erased excessively intensely, single or multiple programming of this memory cell can be effected.

The object can also be achieved by a nonvolatile memory device for storing data, comprising at least one memory cell, at least one sense amplifier for reading out the content of the at least one memory cell, a page memory for buffer-storing data used as a basis for defining the driving of the at least one memory cell during the erasure or programming, and a control device for controlling the erasure or programming of the at least one memory cell, the control device for erasing or programming the at least one memory cell being operable to perform of the following steps of: performing a first erasure or programming operation in a manner dependent on the data stored in the page memory, reading out the content of the erased or programmed memory cells, modifying the content of the page memory in a manner dependent on the data read out, and performing a further erasure or programming operation in a manner dependent on the modified data, and the at least one sense amplifier having a connection to the page memory via which the data read out from the erased or programmed memory cell by the sense amplifier are fed to the page memory, and the content of the page memory being modified in a manner solely dependent on these data and control signals controlling the temporal sequence.

The page memory may contain at least one memory element, each memory element containing a buffer memory for storing a data bit and a transistor, the source terminal of which is connected to the output terminal of the sense amplifier, the drain terminal of which is connected to the buffer memory directly or via further components of the memory element, and to the gate terminal of which is applied a control signal which is output by the control device and controls the temporal sequence. The page memory may contain at least one memory element, each memory element containing a buffer memory for storing a data bit and two series-connected transistors, a constant voltage being applied to the source terminal of the first transistor, the drain terminal of the first transistor being connected to the source terminal of the second transistor, the drain terminal of the second transistor being connected to the buffer memory directly or via further components of the memory element, and, of the gate terminals of the first transistor and of the second transistor, the gate terminal of one transistor is connected to the output terminal of the sense amplifier and the gate terminal of the other transistor has applied to it a control signal which is output by the control device and controls the temporal sequence. The buffer memory can be formed by two inverters reverse-connected in parallel.

The method according to the invention and the memory device according to the invention make it possible to dispense with the combination devices which are present in the conventional arrangement in accordance with FIG. 3 and which combine the sense amplifier output signals with the data which should be stored in the memory cells read.

Dispensing with the combination devices present in the conventional arrangement in accordance with FIG. 3, and, accompanying this, the reduction of the number and/or length of the buses to be provided, make it possible for the memory device according to the invention to be able to be produced considerably smaller and less expensively and, moreover, to have a significantly lower energy requirement. Independently of this, the modification of the page memory content can be carried out more rapidly than is the case for instance with the conventional arrangement in accordance with FIG. 3.

Furthermore, the method according to the invention and the memory device according to the invention make it possible to subsequently eliminate not only excessively weak programming but also in addition excessively weak or excessively intense erasure.

BRIEF DESCRIPTION OF THE DRAWINGS

The invention is explained in more detail below on the basis of exemplary embodiments with reference to the figures, in which FIG. 7 shows the construction of a third exemplary embodiment of the page memory of the arrangement shown in FIG. 4.

DETAILED DESCRIPTION

The memory device whose construction and erasure and programming are described below is a flash memory in the example under consideration. However, the particular features of the memory device presented here and of the method presented here can also be applied to other nonvolatile memory devices such as, by way of example, but not exclusively, EEPROMs.

Figure 4:
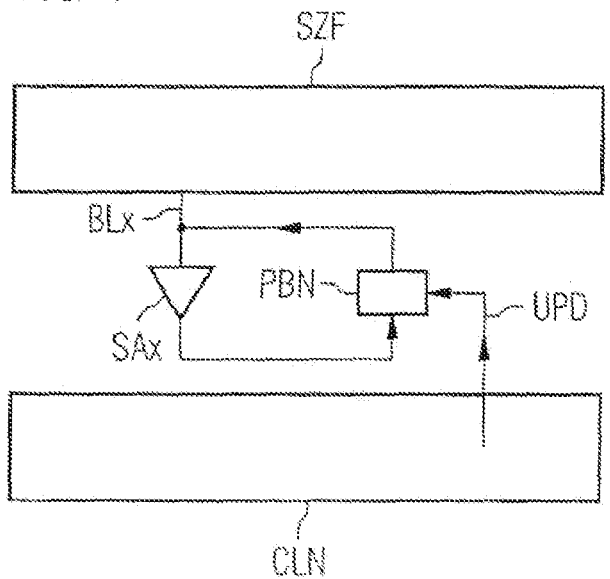
FIG. 4 shows the arrangement—described in more detail below—for programming and/or erasing a flash memory.

The fundamental construction of the arrangement described in more detail below is illustrated in FIG. 4. The arrangement shown in FIG. 4 contains a memory cell array SZF, a multiplicity of sense amplifiers SA1 to SAn, of which only a single sense amplifier SAx is illustrated, however, for the sake of clarity, a page memory PBN, and a control device CLN.

Figure 1:
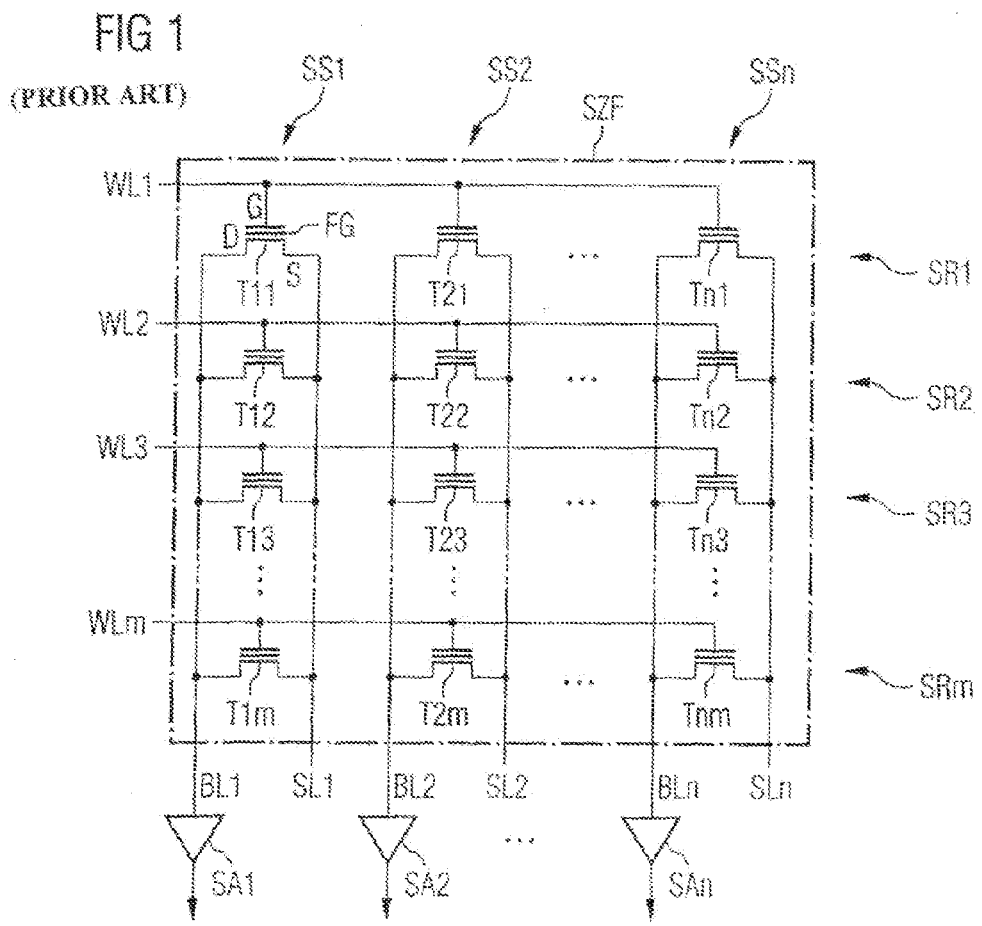
FIG. 1 shows an illustration for elucidating the construction and the function of a flash memory.

In the example under consideration, the memory cell array SZF is the memory cell array shown in FIG. 1, but may also have a different construction. In the example under consideration, the memory cell array SZF is subdivided into a multiplicity of pages, each page comprising a multiplicity of memory cells. In the example under consideration, a page is formed by a memory cell row. However, provision could also be made for each page to comprise only part of a memory cell row. It is also possible for a page to comprise only a single memory cell. Independently of this it is also possible for the memory cell array to comprise only a single page.

In the example under consideration, the memory cell array is programmed page by page. That is to say that all the memory cells of a page can in each case be programmed simultaneously. Which memory cells of a page are actually programmed in each case depends, however, on the data to be written to the memory cells.

The erasure and read-out of the memory cells may likewise be effected page by page, but this is less likely to be the case. Usually, the memory cells that can be read simultaneously and the memory cells that can be erased simultaneously are not identical with the memory cells of one page and can be defined independently of one another.

With regard to further details concerning the memory cell array SZF, reference is made to FIG. 1 and the description referring thereto.

The sense amplifiers of the arrangement shown in FIG. 4 correspond to the sense amplifiers SA1 to SAn shown in FIG. 1 and serve for reading out the data stored in the memory cell array SZF. In the example under consideration, the number of sense amplifiers is equal to the number of memory cells per page. To put it more precisely, each memory cell of a page is assigned a dedicated sense amplifier. For the sake of completeness, it should be pointed out that provision may also be made of fewer sense amplifiers, for example only half as many sense amplifiers, and the sense amplifiers present may be alternately connected to different bit lines via multiplexers or the like.

The page memory PBN serves, inter alia, for buffer-storing the data to be written to a page of the memory cell array SZF or data dependent thereon and has a number of memory elements corresponding to the number of memory cells per page. Each memory element of the page memory is assigned to a specific memory cell of the memory cell array SZF and connected to the bit line which is connected to the assigned memory cell. Via this connection, the bit line voltage required for programming or non-programming is applied to the bit lines during the programming of the memory cells connected thereto. In this case, the fact of whether the bit line voltage required for programming is applied to the bit line or the bit line voltage required for non-programming is applied to the bit line depends on the data stored in the page memory PBN. The page memory PBN furthermore has even further functions, but these will not be discussed in greater detail until later.

The page memory PBN can be written to by means of the control device CLN. Furthermore, the content of the page memory PBN can be modified by the sense amplifiers. For this purpose, the sense amplifiers present and the page memory are connected to one another. To put it more precisely, each sense amplifier is connected to the memory element of the page memory PBN which is assigned to the memory cell read by the relevant sense amplifier. The page memory PBN is furthermore also connected to the control device CLN via a control line UPD. The connection between the page memory PBN and the control device CLN may also comprise a plurality of control lines (see for example FIG. 7).

The modification of the content of the page memory PBN by the sense amplifiers can be used for different purposes.

A first possibility for the use of the modification of the content of the page memory PBN by the sense amplifiers consists in using this modification as a step of a method—referred to below as subsequent programming—by means of which memory cells that have not been programmed properly, to put it more precisely have not been programmed intensely enough, are subjected to a further programming operation.

A second possibility for the use of the modification of the content of the page memory PBN by the sense amplifiers consists in using this modification as a step of a method—referred to below as subsequent erasure—by means of which memory cells that have not been erased properly, to put it more precisely have not been erased intensely enough, are subjected to a further erasure operation.

A third possibility for use of the modification of the content of the page memory PBN by the sense amplifiers consists in using this modification as a step of a method—referred to below as erasure attenuation—by means of which memory cells that have not been erased properly, to put it more precisely have been erased excessively intensely, are subjected to a programming operation.

The subsequent programming is preferably effected directly after the programming of memory cells. During a process of writing to a page of the memory cell array that comprises programming and then subsequent programming, the following steps are performed in the order specified:

B1) the data to be written to the memory cells or data dependent thereon are written to the page memory PBN by means of the control device CLN, a value—referred to hereinafter as programming value—being written to those memory elements of the page memory which are assigned to a memory cell to be programmed, and a value—referred to hereinafter as non-programming value—being written to those memory elements of the page memory PBN which are assigned to a memory cell that is not to be programmed (that is to be left unchanged), B2) programming of the page to be programmed taking account of the data stored in the page memory PBN, those memory cells which are assigned a memory element of the page memory PBN that stores the programming value being programmed, and those memory cells which are assigned a memory element of the page memory PBN that stores the non-programming value not being programmed, B3) read-out of the memory cells of the programmed page and forwarding of the output signals of the sense amplifiers to the respectively assigned memory elements of the page memory PBN, B4) modification of the content of the page memory PBN in a manner solely dependent on the output signals of the sense amplifiers, so that after the modification the programming value is stored in those memory elements of the page memory PBN which are assigned to memory cells to be programmed and which are assigned sense amplifiers whose output signals indicate that the memory cell read is a non-programmed memory cell, and the non-programming value is stored in all other memory elements of the page memory PBN, and B5) if required, to put it more precisely if, after the modification, the programming value is stored in one, a plurality, or all of the memory elements of the page memory PBN, repetition of steps B2 to B5.

The subsequent erasure and the erasure attenuation are preferably effected directly after the erasure of memory cells. During a process of erasing memory cells of the memory cell array that comprises subsequent erasure and/or erasure attenuation, the following steps are performed in the order specified:

L1) a value—referred to hereinafter as erasure value—is written to the memory elements of the page memory PBN which are assigned to the memory cells of the memory cell array SZF that are to be erased, by means of the control device CLN, L2) erasure of the memory cells which are assigned a memory element of the page memory PBN that stores the erasure value, and, if subsequent erasure is to be carried out as required:

NL3) read-out of the erased memory cells and forwarding of the output signals of the sense amplifiers to the respectively assigned memory elements of the page memory PBN, NL4) modification of the content of the memory elements of the page memory in a manner solely dependent on the output signals of the sense amplifiers, and NL5) if required, to put it more precisely if, after the modification, the erasure value is stored in one, a plurality, or all of the memory elements of the page memory PBN, repetition of steps L2 and NL2 to NL5, and/or, if erasure attenuation is to be carried out as required:

LA3) read-out of the erased memory cells and forwarding of the output signals of the sense amplifiers to the respectively assigned memory elements of the page memory PBN, LA4) modification of the content of the memory elements of the page memory in a manner solely dependent on the output signals of the sense amplifiers, and LA5) if required, to put it more precisely if, after the modification, the erasure value is stored in one, a plurality, or all of the memory elements of the page memory PBN, carrying out of a programming operation for the memory cells which are assigned a memory element that stores the erasure value, for the attenuation of the erasure state, and repetition of steps LA3 to LA5.

The read-out effected in steps B3, NL3 and LA3 is effected under different conditions than is the case during the read-out that is carried out during a normal read access to the memory device.

During the read-out of the memory device that is performed as a result of a normal read access to the memory device, the voltages which are applied during read-out to the source line and to the word line of the memory cells to be read are chosen such that the difference between said voltages lies in the middle between VT2 and VT3 (see FIG. 2), and that the word line voltage is at the same time so large that the memory transistors whose threshold voltage is less than the difference between the source line voltage and the word line voltage enter into the on state.

By contrast, during the read-out of the memory device that is carried out in step B3, the voltages which are applied during read-out to the source line and to the word line of the memory cells to be read are chosen such that the difference between said voltages amounts to VT3 (see FIG. 2), and that the word line voltage is at the same time so large that the memory transistors whose threshold voltage is less than the difference between the source line voltage and the word line voltage enter into the on state. This has the effect that only memory transistors whose threshold voltage is greater than VT3 are identified as programmed memory transistors by the sense amplifiers, and that all other memory transistors are identified as non-programmed memory transistors. The memory transistors which are classified as non-programmed by the sense amplifiers in step B3 thus also include memory transistors which, during normal read-out of the memory device, although they would be identified as programmed memory transistors, have a threshold voltage lying below VT3 and, consequently, are only comparatively weakly programmed. These weakly programmed memory transistors, provided that they are not defective, can be put into a state in which they have a threshold voltage lying above VT3 by means of single or multiple reprogramming.

During the read-out of the memory device that is carried out in step NL3, the voltages which are applied during read-out to the source line and to the word line of the memory cells to be read are chosen such that the difference between said voltages amounts to VT2 (see FIG. 2), and that the word line voltage is at the same time so large that the memory transistors whose threshold voltage is less than the difference between the source line voltage and the word line voltage enter into the on state. This has the effect that only memory transistors whose threshold voltage is lower than VT2 are identified as erased memory transistors by the sense amplifiers, and that all other memory transistors are identified as non-erased memory transistors. The memory transistors which are classified as non-erased by the sense amplifiers in step NL3 thus also include memory transistors which, during normal read-out of the memory device, although they would be identified as erased memory transistors, have a threshold voltage lying above VT2 and, consequently, are only comparatively weakly erased. These weakly erased memory transistors, provided that they are not defective, can be put into a state in which they have a threshold voltage lying below VT2 by means of single or multiple re-erasure.

During the read-out carried out in step LA3, the voltages which are applied during read-out to the source line and to the word line of the memory cells to be read are chosen such that the difference between said voltages amounts to VT1 (see FIG. 2), and that the word line voltage is at the same time so large that the memory transistors whose threshold voltage is less than the difference between the source line voltage and the word line voltage enter into the on state. At the same time, an even smaller word line voltage is applied to the word lines of the remaining memory cell rows, in which case said word line voltage may also be a negative voltage; it is so small (so intensely negative) that of the memory transistors situated in these memory cell rows even those memory transistors which are erased so intensely that they would be in the normally on state during normal read-out of the memory device can no longer enter into the on state. This has the effect that only the excessively intensely erased memory transistors of the memory cell row in which the memory transistors to be read are situated are identified as erased memory transistors by the sense amplifiers, and that all the other memory transistors are identified as non-erased memory transistors. These excessively intensely erased memory transistors, provided that they are not defective, can be put into a state in which they have a threshold voltage lying between VT1 and VT2 by means of a single or multiple programming operation.

A number of possibilities exist for the modification of the content of the page memory PBN by the sense amplifiers.

Figure 5:
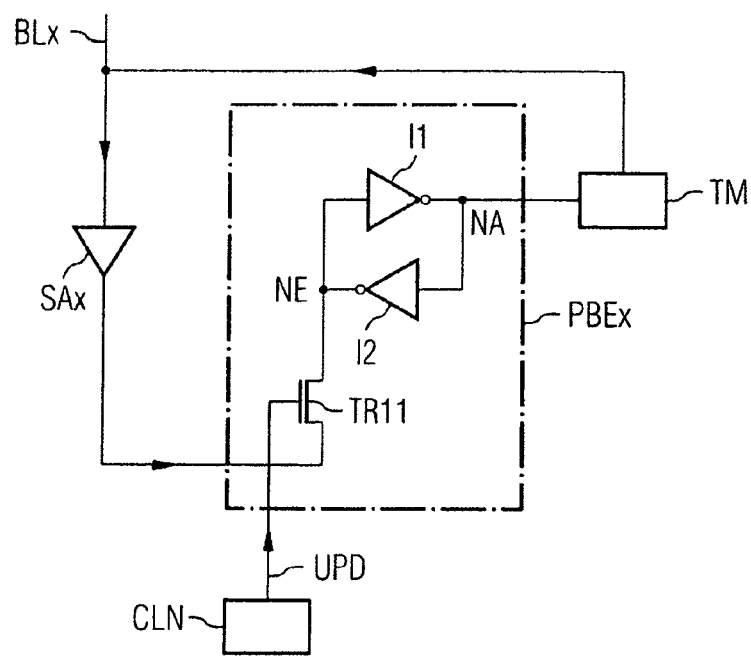
FIG. 5 shows the construction of a first exemplary embodiment of a page memory of the arrangement shown in FIG. 4.

A first possibility is illustrated in FIG. 5. FIG. 5 shows the sense amplifier SAx, the memory element PBEx of the page memory PBN that is assigned to said sense amplifier, a conversion device TM and the control device CLN.

The memory element PBEx comprises a series circuit formed by a transistor TR11 and a buffer memory, the buffer memory being formed, in the example under consideration, by a latch comprising two inverters I1 and I2 reverse-connected in parallel. The source terminal of the transistor TR11 is connected to the output terminal of the sense amplifier SAx, the gate terminal of the transistor TR11 is connected via a control line UPD to the control device CLN, and the drain terminal of the transistor TR11 is connected to one connection point—referred to hereinafter as node NE—of the inverters I1 and I2. The other connection point—referred to hereinafter as node NA—of the inverters I1 and I2 constitutes the output terminal of the memory element PBEx and is connected via the conversion device TM to the assigned bit line BLx.

The conversion device TM may undertake various tasks. It may for example ensure that it is only during the programming of a memory cell that a programming voltage effecting programming of the relevant memory cell can be applied to the bit line assigned to said memory cell. It may furthermore be used for converting the voltage output from the memory element PBEx into the voltage which has to be applied to the bit line during the programming or non-programming. This last is necessary if the voltage output from the memory element PBEx is not the voltage which has to be applied to the bit line of the assigned memory cell in order that the action prescribed by the output voltage of the memory element is performed in said memory cell.

The arrangement shown in FIG. 5 is suitable, as is described in greater detail below, in particular for erasing memory cells and subsequently carrying out the abovementioned subsequent erasure for the excessively weakly erased memory cells.

If a component of the system containing the memory device would like to erase memory cells of the memory cell array, the relevant component communicates to the control device CLN corresponding control commands and also the start address or the addresses of the memory cells to be erased. It may also be provided that the control device CLN inherently automatically instigates erasure, for example if it has received, from a component of the system containing the memory device, the command to write new data to the memory device.

The control device CLN thereupon writes to the page memory PBN, to put it more precisely the latches of the memory elements PBEx that are formed by the inverters I1 and I2. In the example under consideration, it is the case that the control device CLN writes the value 0 to those memory elements PBEx of the page memory PBN which are assigned to memory cells of the memory cell array SZF that are to be erased, and writes the value 1 to all other memory elements PBEx of the page memory PBN. That is to say that, in the example under consideration, the value 0 is the erasure value already mentioned above. This writing to the page memory PBN by the control device CLN is effected in step L1 mentioned above.

The memory cells to be erased are then erased. In this case, those memory cells which are assigned a memory element PBEx of the page memory PBN that stores the erasure value, in other words a memory element PBEx of the page memory PBN that stores the value 0, are erased. This erasure is effected in step L2 mentioned above.

Figure 2:
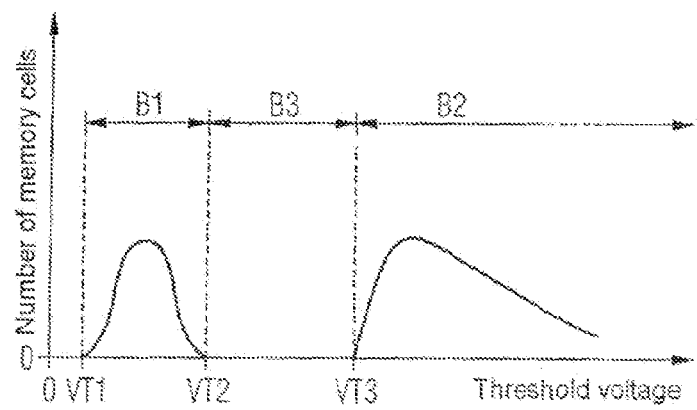
FIG. 2 shows a diagram for illustrating the different threshold voltages of the memory transistors of a flash memory, and the number of memory transistors which have the respective threshold voltages.

Ideally, the memory cells erased in step L2 are erased properly, that is to say neither too weakly nor too intensely, so that the threshold voltages of the erased memory cells lie between VT1 and VT2 (see FIG. 2). Since this is not always the case, however, it proves to be advantageous if steps NL3 to NL5 mentioned above are subsequently carried out, to put it more precisely subsequent erasure of the excessively weakly erased memory cells is carried out.

In this case, firstly the read-out of the erased memory cells that is effected in step NL3 is carried out. This read-out has already been described extensively above and does not require a further detailed explanation. All that is worth mentioning is that in the example under consideration, sense amplifiers are used which output a voltage representing a level 0 if the memory cell read is identified as erased (has a threshold voltage lying below VT2), and which output a voltage representing a level 1 if the memory cell read is identified as not erased (has a threshold voltage lying above VT2). As can be seen from FIG. 5, the output signals of the sense amplifiers are fed to the source terminal of the transistor TR11.

If the output signals of the sense amplifiers are valid, the control signal UPD, normally having a low level, is momentarily switched to the high level. What happens then depends on the output voltage of the sense amplifiers and is described below for the sense amplifier SAx and the memory element PBEx of the page memory PBN that is assigned thereto.

It shall initially be assumed that the memory transistor read by the sense amplifier SAx is properly erased, that is to say has for example a threshold voltage lying between VT1 and VT2. In this case, the sense amplifier SAx outputs a signal having the level 0. Furthermore, it should again be pointed out at this juncture that a bit having the value 0 is stored in the memory elements PBEx of the page memory PBN which are assigned to the memory cells of the memory cell array that are to be erased. That is to say that a voltage having the level 0 is present at the node NA of such a memory element PBEx, and a voltage having the level 1 is present at the node NE. The signal UPD fed to the gate terminal of the transistor TR11 by the control device CLN initially still has a low level, so that the transistor TR11 turns off and the potentials established at the nodes NA and NE cannot alter.

If, in this state, the signal UPD fed to the memory element PBEx by the control device momentarily goes to the high level, the transistor TR11 is turned on, however, so that the output of the sense amplifier SAx is connected to the node NE of the memory element PBEx. Since the signal output by the sense amplifier SAx is driven more strongly than the signal output by the inverter I2, the node NE goes to a low potential. This in turn has the consequence that the node NA goes to a high potential, and, consequently, a bit having the value 1, that is to say no longer the erasure value, is now stored in the latch formed by the inverters I1 and I2.

The situation is different if the memory transistor read by the sense amplifier SAx is excessively weakly erased, that is to say has a threshold voltage lying above VT2. In this case, the sense amplifier SAx outputs a signal having the level 1. In this case, the potential established at the node NE and thus also the potential established at the node NA remain unchanged, so that a bit having the value 0, that is to say the erasure value, continues to be stored in the latch formed by the inverters I1 and I2.

The described modification of the content of the memory elements PBEx of the page memory is the modification effected in step N4 mentioned above.

Ideally, all ones are stored in the page memory PBN after the read-out of the erased memory cells. This means that all of the memory cells erased in step L2 are properly erased, and no subsequent erasure is required. If, on the other hand, one or more zeroes are stored in the page memory PBN, this means that the erasure was not successful, to put it more precisely that those memory cells of the memory cell array which are assigned the memory elements PBE of the page memory PBN that store bits having the value 0 were excessively weakly erased.

In step NL5 mentioned above, a check is made to determine whether all the memory cells erased in step L2 were erased properly. If it is found here that this is not the case, to put it more precisely if the erasure value is stored in one or more memory elements of the page memory PBN, the erasure operation (step L2) is repeated. In this case, however, only those memory cells of the memory cell array which were not erased properly, that is to say those memory cells which are assigned a memory element PBEx of the page memory PBN that stores the erasure value, are erased again.

Afterward, steps NL3 to NL5 and the programming of the excessively intensely erased memory cells can be repeated. In principle, an arbitrary number of repetitions of these steps can be carried out. Preferably, however, a predetermined maximum number of repetitions is carried out at most. If still not all of the memory cells to be erased have been properly erased after this number of repetitions it can be assumed that the memory device is defective. For the sake of completeness, it should be noted that also when all the memory cells to be erased have been properly erased, it is no longer necessary to carry out any further repetitions.

As a result of the single or multiple subsequent erasure of the excessively weakly erased memory cells, the threshold voltage thereof alters. To put it more precisely, provided that the excessively weakly erased memory cells are not defective, the threshold voltage of the relevant memory transistors thereby becomes smaller than the difference between the source line and word line voltages used during the read-out in step NL3. That is to say that an excessively weakly erased memory cell becomes a normally erased memory cell as a result of the subsequent erasure.

The arrangement shown in FIG. 5 can be modified in diverse ways. By way of example, an arrangement which can likewise be used for subsequent erasure is attained if
- the value 1 is used as erasure value, and the sense amplifiers output a signal having the level 1 if the threshold voltages of the memory cells read are less than the difference between the word line and source line voltages used in step NL3, and output a signal having the level 0 in all other cases, or
- the value 1 is used as erasure value and the drain terminal of the transistor T11 is not connected to the node NE but rather to the node NA, or
- the drain terminal of the transistor T11 is not connected to the node NE but rather to the node NA, and the sense amplifiers output a signal having the level 1 if the threshold voltages of the memory cells read are less than the difference between the word line and source line voltages used in step NL3 , and output a signal having the level 0 in all other cases.

If the arrangement shown in FIG. 5 is modified "only" to the effect that the drain terminal of the transistor T11 is not connected to the node NE but rather to the node NA, then this modified arrangement can be used for erasing memory cells and subsequently carrying out the erasure attenuation of the excessively intensely erased memory cells that has already been mentioned above.

The erasure of the memory cells to be erased is effected like the erasure in the case of the arrangement shown in FIG. 5 by means of the performance of steps L1 and L2.

Ideally, the memory cells erased in step L2 are erased properly, that is to say neither too weakly nor too intensely, so that the threshold voltages of the erased memory cells lie between VT1 and VT2 (see FIG. 2). Since this is not always the case, however, it proves to be advantageous if steps L3 to L5 mentioned above are subsequently carried out, to put it more precisely erasure attenuation of the excessively intensely erased memory cells is carried out.

In this case, firstly the read-out of the erased memory cells that is effected in step L3 is carried out. This read-out has already been described extensively above and does not require a further detailed explanation. All that is worth mentioning is that in the example under consideration, sense amplifiers are used which—as in the case of the arrangement shown in FIG. 5—output a voltage representing the level 0 if a current flows via the bit line connected to them, and output a voltage representing the level 1 if no current flows via the bit line connected to them. The output signals of the sense amplifiers are fed to the source terminal of the transistor TR11 of the modified arrangement.

If the output signals of the sense amplifiers are valid, the control signal UPD, normally having a low level, is momentarily switched to the high level. What happens then depends on the output voltage of the sense amplifiers and is described below for the sense amplifier SAx and the memory element PBEx of the page memory PBN that is assigned thereto.

It shall initially be assumed that the memory transistor read by the sense amplifier SAx is not erased excessively intensely, that is to say has for example a threshold voltage lying between VT1 and VT2. In this case, the sense amplifier SAx outputs a signal having the level 1. Furthermore, it should again be pointed out at this juncture that a bit having the value 0 is stored in the memory elements PBEx of the page memory PBN which are assigned to the memory cells of the memory cell array that are to be erased. That is to say that a voltage having the level 0 is present at the node NA of such a memory element PBEx. The signal UPD fed to the gate terminal of the transistor TR11 by the control device CLN initially still has a low level, so that the transistor TR11 turns off and the potential established at the node NA cannot alter.

If, in this state, the signal UPD fed to the memory element PBEx by the control device momentarily goes to the high level, the transistor TR11 is turned on, however, so that the output of the sense amplifier SAx is connected to the node NA of the memory element PBEx. Since the signal output by the sense amplifier SAx is driven more strongly than the signal output by the inverter I1, the node NA goes to a high potential so that a bit having the value 1, that is to say no longer the erasure value, is now stored in the latch formed by the inverters I1 and I2.

The situation is different if the memory transistor read by the sense amplifier SAx is excessively intensely erased, that is to say is normally on under the read-out conditions. In this case, the sense amplifier SAx outputs a signal having the level 0. In this case, the potential established at the node NA remains unchanged, so that a bit having the value 0, that is to say the erasure value, continues to be stored in the latch formed by the inverters I1 and I2.

The described modification of the content of the memory elements PBEx of the page memory is the modification effected in step LA4 mentioned above.

Ideally, all ones are stored in the page memory PBN after the read-out of the erased memory cells. This means that none of the memory cells erased in step L2 is excessively intensely erased, and so no erasure attenuation is required. If, on the other hand, one or more zeroes are stored in the page memory PBN, this means that the erasure was not successful, to put it more precisely that those memory cells of the memory cell array which are assigned the memory elements PBE of the page memory PBN that store bits having the value 0 were excessively intensely erased.

In step L5 mentioned above, a check is made to determine whether all the memory cells erased in step L2 were erased properly. If it is found here that this is not the case, to put it more precisely if the erasure value is stored in one or more memory elements of the page memory PBN, a programming operation is carried out. In this case, however, only those memory cells of the memory cell array which were not erased properly, that is to say those memory cells which are assigned a memory element PBEx of the page memory PBN that stores the erasure value, are programmed.

Afterward, steps L3 to L5 and the programming of the then still excessively intensely erased memory cells can be repeated. In principle, an arbitrary number of repetitions of these steps can be carried out. Preferably, however, a predetermined maximum number of repetitions is carried out at most. If still not all of the memory cells to be erased have been properly erased after this number of repetitions it can be assumed that the memory device is defective. For the sake of completeness, it should be noted that also when all the memory cells to be erased have been properly erased, it is no longer necessary to carry out any further repetitions.

As a result of the single or multiple programming of the excessively intensely erased memory cells, the threshold voltage thereof alters. To put it more precisely, the threshold voltage thereby migrates, provided that the excessively intensely erased memory cells are not defective, into the range between VT1 and VT2. That is to say that an excessively intensely erased memory cell becomes a normally erased memory cell as a result of the programming.

The modified arrangement can be modified in diverse ways. By way of example, an arrangement which can likewise be used for erasure attenuation is attained if the value 1 is used as erasure value, and sense amplifiers are used which output a voltage representing the level 0 if a current flows via the bit line connected to them, and output a voltage representing the level 1 if no current flows via the bit line connected to them, or the value 1 is used as erasure value, and the drain terminal of the transistor T11 is not connected to the node NA but rather to the node NE, or the drain terminal of the transistor T11 is not connected to the node NA but rather to the node NE, and sense amplifiers are used which output a voltage representing the level 0 if a current flows via the bit line connected to them, and output a voltage representing the level 1 if no current flows via the bit line connected to them.

Figure 6:
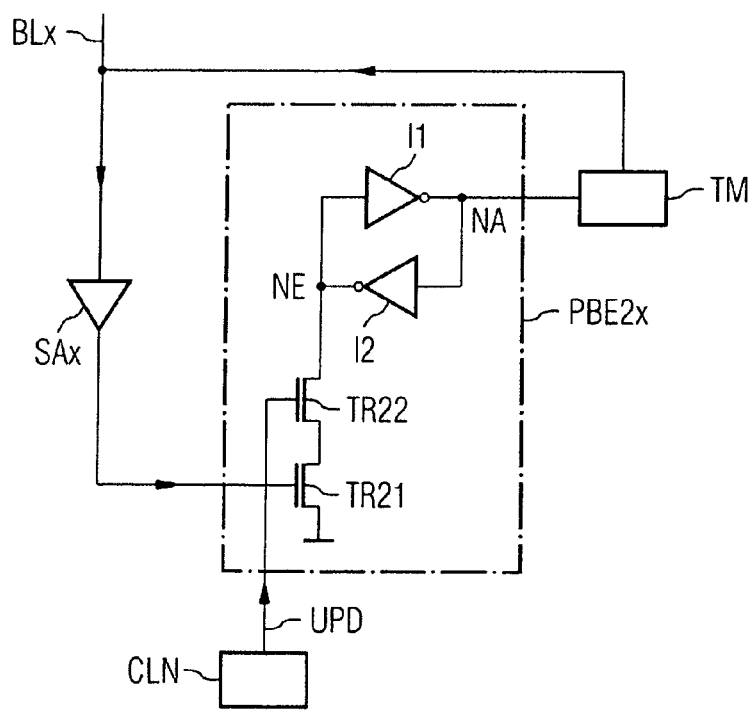
FIG. 6 shows the construction of a second exemplary embodiment of the page memory of the arrangement shown in FIG. 4.

A further possibility for modification of the content of the page memory PBN by the sense amplifiers is illustrated in FIG. 6.

The arrangement shown in FIG. 6 is suitable, as is described in more detail below, in particular for erasing memory cells and subsequently carrying out the erasure attenuation mentioned above for the excessively intensely erased memory cells.

The construction of the arrangement shown in FIG. 6 largely corresponds to the construction of the arrangement shown in FIG. 5. Therefore, the following description of the arrangement in accordance with FIG. 6 is mostly restricted to the differences with respect to the arrangement in accordance with FIG. 5. With regard to further details concerning the arrangement in accordance with FIG. 6, reference is made to the above extensive description of the arrangement in accordance with FIG. 5. Components designated by the same reference symbols designate identical or mutually corresponding components.

FIG. 6 shows the sense amplifier SAx, a memory element PBE2x of the page memory PBN that is assigned to said sense amplifier, the conversion device TM, and the control device CLN.

The main difference between the arrangement in accordance with FIG. 6 and the arrangement in accordance with FIG. 5 consists in the differently constructed and operating memory elements PBE2 and PBE of the page memory PBN. However, the memory elements PBE2 and PBE do also partly match.

A memory element PBE2x comprises a series circuit formed by a first transistor TR21, a second transistor TR22, and a buffer memory, the buffer memory in the example under consideration being formed by a latch comprising two inverters I1 and I2 reverse-connected in parallel. Of the transistor TR21, the source terminal is connected to ground, the gate terminal is connected to the output terminal of the sense amplifier SAx, and the drain terminal is connected to the source terminal of the second transistor TR22. Of the second transistor TR22, the source terminal is connected to the drain terminal of the first transistor TR21, the gate terminal is connected via the line UPD to the control device CLN, and the drain terminal is connected to the connection point of the inverters I1 and I2 that is designated as node NE. The other connection point of the inverters I1 and I2, designated hereinafter as node NA, constitutes the output terminal of the memory element PBE2x and is connected via the conversion device TM to the assigned bit line BLx. It should be apparent and needs no further explanation that the gate terminals of the transistors TR21 and TR22 could also be interchanged.

As has already been mentioned above, the arrangement in accordance with FIG. 6 can be used for erasing memory cells and subsequently carrying out the erasure attenuation of the excessively intensely erased memory cells that has already been mentioned above.

The erasure of the memory cells to be erased is effected like the erasure in the case of the arrangement shown in FIG. 5 by means of the performance of steps L1 and L2.

Ideally, the memory cells erased in step L2 are erased properly, that is to say neither too weakly nor too intensely, so that the threshold voltages of the erased memory cells lie between VT1 and VT2 (see FIG. 2). Since this is not always the case, however, it proves to be advantageous if steps L3 to L5 mentioned above are subsequently carried out, to put it more precisely erasure attenuation of the excessively intensely erased memory cells is carried out.

In this case, firstly the read-out of the erased memory cells that is effected in step L3 is carried out. This read-out has already been described extensively above and does not require a further detailed explanation. All that is worth mentioning is that in the example under consideration, sense amplifiers are used which—as in the case of the arrangement shown in FIG. 5—output a voltage representing the level 0 if a current flows via the bit line connected to them, and output a voltage representing the level 1 if no current flows via the bit line connected to them. The output signals of the sense amplifiers are fed to the gate terminal of the transistor TR21.

If the output signals of the sense amplifiers are valid, the control signal UPD, normally having a low level, is momentarily switched to the high level. What happens then depends on the output voltage of the sense amplifiers and is described below for the sense amplifier SAx and the memory element PBEx of the page memory PBN that is assigned thereto.

It shall initially be assumed that the memory transistor read by the sense amplifier SAx is properly erased, that is to say has for example a threshold voltage lying between VT1 and VT2. In this case, the sense amplifier SAx outputs a signal having the level 1. Furthermore, it should again be pointed out at this juncture that a bit having the value 0 is stored in the memory elements PBE2x of the page memory PBN which are assigned to the memory cells of the memory cell array that are to be erased. That is to say that a voltage having the level 0 is present at the node NA of the memory element PBE2x, and a voltage having the level 1 is present at the node NE of the memory element PBE2x. The signal UPD fed to the gate terminal of the transistor TR22 by the control device CLN initially still has a low level, so that the transistor TR22 turns off and the potentials established at the nodes NA and NE cannot alter.

If, in this state, the signal UPD fed to the memory element PBE2x by the control device momentarily goes to the high level, the transistors TR21 and TR22 are turned on, however, so that the node NE of the memory element PBE2x is connected to ground. Since the potential established at the node NE is pulled to ground by the ground terminal more strongly than it is driven to high potential by the inverter I2, the node NE goes to a low potential. The consequence of this is the node NA goes to a high potential, and, consequently, a bit having the value 1, that is to say no longer the erasure value, is now stored in the latch formed by the inverters I1 and I2.

The situation is different if the memory transistor read by the sense amplifier SAx is excessively intensely erased, that is to say is normally on under the read-out conditions. In this case, the sense amplifier SAx outputs a signal having the level 0. In this case, the potentials established at the node NA remains unchanged, so that a bit having the value 0, that is to say the erasure value, continues to be stored in the latch formed by the inverters I1 and I2.

The described modification of the content of the memory elements PBE2x of the page memory is the modification effected in step LA4 mentioned above.

Ideally, all ones are stored in the page memory PBN after the read-out of the erased memory cells. This means that none of the memory cells erased in step L2 is excessively intensely erased, and so no erasure attenuation is required. If, on the other hand, one or more zeroes are stored in the page memory PBN, this means that the erasure was not successful, to put it more precisely that those memory cells of the memory cell array which are assigned the memory elements PBE of the page memory PBN that store bits having the value 0 were excessively intensely erased.

In step L5 mentioned above, a check is made to determine whether all the memory cells erased in step L2 were erased properly. If it is found here that this is not the case, to put it more precisely if the erasure value is stored in one or more memory elements of the page memory PBN, a programming operation is carried out. In this case, however, only those memory cells of the memory cell array which were not erased properly, that is to say those memory cells which are assigned a memory element PBE2x of the page memory PBN that stores the erasure value, are programmed.

Afterward, steps L3 to L5 and the programming of the then still excessively intensely erased memory cells can be repeated. In principle, an arbitrary number of repetitions of these steps can be carried out. Preferably, however, a predetermined maximum number of repetitions is carried out at most. If still not all of the memory cells to be erased have been properly erased after this number of repetitions it can be assumed that the memory device is defective. For the sake of completeness, it should be noted that also when all the memory cells to be erased have been properly erased, it is no longer necessary to carry out any further repetitions.

As a result of the single or multiple programming of the excessively intensely erased memory cells, the threshold voltage thereof alters. To put it more precisely, the threshold voltage thereby migrates, provided that the excessively intensely erased memory cells are not defective, into the range between VT1 and VT2. That is to say that an excessively intensely erased memory cell becomes a normally erased memory cell as a result of the programming.

The arrangement shown in FIG. 6 can be modified in diverse ways. By way of example, an arrangement which can likewise be used for erasure attenuation is attained if
- the value 1 is used as erasure value, and sense amplifiers are used which output a voltage representing the level 0 if a current flows via the bit line connected to them, and output a voltage representing the level 1 if no current flows via the bit line connected to them, or
- the value 1 is used as erasure value, and the drain terminal of the transistor T22 is not connected to the node NE but rather to the node NA, or
- the drain terminal of the transistor T22 is not connected to the node NE but rather to the node NA, and sense amplifiers are used which output a voltage representing the level 0 if a current flows via the bit line connected to them, and output a voltage representing the level 1 if no current flows via the bit line connected to them.

Further modifications are possible if the arrangement shown in FIG. 6 is modified to the effect that the source terminal of the transistor TR21 is not connected to ground, but rather has a positive voltage applied to it, and/or PMOS transistors are used instead of NMOS transistors. The use of a PMOS transistor instead of an NMOS transistor, incidentally, also opens up further modification possibilities in the case of the arrangement shown in FIG. 5.

If the arrangement shown in FIG. 6 is modified "only" to the effect that the drain terminal of the transistor T22 is not connected to the node NE but rather to the node NA, this modified arrangement can then be used for programming memory cells and subsequently carrying out the subsequent programming of the excessively weakly programmed memory cells that has already been mentioned above.

If a component of the system containing the memory device would like to write data to the memory device, to put it more precisely would like to write anew to a page of the memory device, the relevant component communicates to the control device CLN corresponding control commands and also the data to be written to the memory device and the address under which the data are to be stored in the memory device.

The data which are to be written to the memory device and are fed to the control device CLN, or data based thereon, are firstly written to the page memory PBN, to put it more precisely are stored in the latches of the memory elements PBE2 that are formed by the inverters I1 and I2. In general, the control device CLN already instigates beforehand an erasure operation that erases the memory cells of the page to which the new data are to be written. This has the effect that data bits having the value 0 are then stored in all the memory cells of the relevant page. In the example under consideration, it is the case that the control device CLN writes the value 1 to those memory elements PBE2x of the page memory PBN which are assigned to memory cells of the memory cell array SZF that are to be programmed, and writes the value 0 to all the other memory elements PBE2x of the page memory PBN. That is to say that, in the example under consideration, the value 1 is the programming value already mentioned above. This writing to the page memory PBN by the control device CLN is effected in step B1 mentioned above.

The memory cells to be programmed are then programmed. In this case, those memory cells which are assigned a memory element PBE2x of the page memory PBN that stores the programming value, that is to say a memory element PBE2x of the page memory PBN that stores the value 1, are programmed. All the other memory cells remain unchanged. That is to say that no action is performed which alters the charge state of the floating gate of the other memory cells. This programming is effected in step B2 mentioned above.

Ideally, the memory cells programmed in step B2 are programmed properly, that is to say not excessively weakly, so that the threshold voltages of the programmed memory cells lie above VT3 (see FIG. 2). Since this is not always the case, however, it proves to be advantageous if steps B3 to B5 mentioned above are subsequently carried out, to put it more precisely subsequent programming of the excessively weakly programmed memory cells is carried out.

In this case, firstly the read-out—effected in step B3—of the page of the memory cell array that has been written to is carried out. This read-out has already been described extensively above and needs no further explanation. All that is worth mentioning is that in the example under consideration, sense amplifiers are used which output a voltage representing the level 0 if a bit having the value 0 is stored in the memory cell read by the relevant sense amplifier, and output a voltage representing the level 1 if a bit having the value 1 is stored in the memory cell read by the relevant sense amplifier. The output signals of the sense amplifiers are fed to the gate terminal of the transistor TR21.

If the output signals of the sense amplifiers are valid, the control signal UPD, normally having a low level, is momentarily switched to the high level. What happens then depends on the output voltage of the sense amplifiers and is described below for the sense amplifier SAx and the memory element PBE2x of the page memory PBN that is assigned thereto.

It shall initially be assumed that the memory transistor read by the sense amplifier SAx is programmed properly, that is to say has a threshold voltage lying above VT3. In this case, the sense amplifier SAx outputs a signal having the level 1. Furthermore, it should again be pointed out at this juncture that a bit having the value 1 is stored in the memory elements PBE2x of the page memory PBN which are assigned to the memory cells of the memory cell array that are to be programmed. That is to say that a voltage having the level 1 is present at the node NA of the memory element PBE2x. The signal UPD fed to the gate terminal of the transistor TR22 by the control device CLN initially still has a low level, so that the transistor TR22 turns off and the potential established at the node NA cannot alter.

If, in this state, the signal UPD fed to the memory element PBE2x by the control device momentarily goes to the high level, the transistors TR21 and TR22 are turned on, however, so that the node NA of the memory element PBE2x is connected to ground. Since the potential established at the node NA is pulled to ground by the ground terminal more strongly than it is driven to high potential by the inverter I1, the node NA goes to a low potential so that a bit having the value 1, that is to say no longer the programming value, is now stored in the latch formed by the inverters I1 and I2.

The situation is different if the memory transistor read by the sense amplifier SAx is excessively weakly programmed, that is to say has a threshold voltage lying below VT3. In this case, the sense amplifier SAx outputs a signal having the level 0, as a result of which the potential established at the node NA remains unchanged, and a bit having the value 1, that is to say the programming value, continues to be stored in the latch formed by the inverters I1 and I2.

During the read-out of the content of a memory cell that is not to be programmed, a voltage representing the non-programming value that is to say a voltage representing the level 0, is present at the node NA of the assigned memory element PBE2x, and the sense amplifier SAx outputs a voltage representing the level 0 (the memory cell read is a non-programmed memory cell). As a result, the potential established at the node NA remains unchanged, so that a bit having the value 0, that is to say the non-programming value, continues to be stored in the latch formed by the inverters I1 and I2.

The described modification of the content of the memory elements PBE2x of the page memory is the modification effected in step B4 mentioned above.

Ideally, all zeroes are stored in the page memory PBN after the read-out of the erased memory cells. This means that none of the memory cells programmed in step B2 is excessively weakly programmed, and, consequently, no subsequent programming is required. If, on the other hand, one or more ones are stored in the page memory PBN, this means that the programming was not successful or at any rate not completely successful, to put it more precisely that those memory cells of the memory cell array which are assigned the memory elements PBE2 of the page memory PBN that store bits having the value 1 were excessively weakly programmed.

In step B5 mentioned above, a check is made to determine whether there are excessively weakly programmed memory cells among the memory cells of the page that has been written to. If it turns out here that this is not the case, to put it more precisely if the programming value is stored in one or more memory elements of the page memory PBN, subsequent programming (repetition of step B2) is carried out. In this case, however, only those memory cells of the memory cell array which were not programmed properly, that is to say those memory cells which are assigned a memory element PBE2x of the page memory PBN that stores the programming value, are programmed.

Afterward, steps B3 to B5 and B2 may be repeated. In principle, an arbitrary number of repetitions of these steps may be carried out. Preferably, however, a predetermined maximum number of repetitions is carried out at most. If still not all of the memory cells to be programmed are properly programmed after this number of repetitions, it can be assumed that the memory device is defective. For the sake of completeness, it should be noted that also when all the memory cells to be erased are properly programmed, it is no longer necessary to carry out any further repetitions.

As a result of the single or multiple subsequent programming of the excessively weakly programmed memory cells, the threshold voltage thereof alters. To put it more precisely, the threshold voltage thereby migrates, provided that the excessively intensely erased memory cells are not defective, into the range lying above VT3. That is to say that an excessively weakly programmed memory cell becomes a properly programmed memory cell as a result of the subsequent programming.

The arrangement that can be used for the subsequent programming can be modified in diverse ways, for example by using 0 as programming value, and/or by using sense amplifiers which output a voltage representing the level 0 if the memory cell read is identified as a programmed memory cell, and output a voltage representing the level 1 if the memory cell read is identified as a non-programmed memory cell, and/or by connecting the drain terminal of the transistor T22 to the node NE rather than to the node NA, and/or by connecting the source terminal of the transistor TR21 to a positive voltage rather than to ground, and/or by using PMOS transistors instead of NMOS transistors.

A further possibility for the modification of the content of the page memory PBN by the sense amplifiers is illustrated in FIG. 7.

FIG. 7 shows the sense amplifier SAx, the memory element PBE3x of the page memory PBN that is assigned to said sense amplifier, a conversion device TM, and the control device CLN.

The arrangement shown in FIG. 7 is a combination of the arrangements shown in FIGS. 5 and 6 or of the modifications based thereon, and moreover contains some extensions. The components of the arrangement shown in FIG. 7 which are designated by the same reference symbols as in the arrangements in accordance with FIGS. 5 and 6 are identical or mutually corresponding components and are not described again below. In this regard, reference is made to FIGS. 5 and 6 and the description referring thereto.

The memory element PBE3x comprises a buffer memory or latch formed by two inverters I1 and I2, and transistors TR31 to TR39. The memory element PBE3x is fed the output signal of the sense amplifier SAx, is connected on the output side to the bit line BLx via the conversion device TM, and is controlled by the control device CLN by means of control signals SET, RESET, UPD1, UPD2, WRITE and SELECT.

The inverters I1 and I2 are reverse-connected in parallel and are connected to one another at nodes NE and NA, the node NA simultaneously being the output terminal of the memory element PBE3x. The signal output by the sense amplifier SAx is fed inter alia to the gate terminal of the transistor TR31. Of said transistor TR31, the source terminal is grounded and the drain terminal is connected to the source terminal of the transistor TR32. The signal SELECT is fed to the gate terminal of the transistor TR32, and the drain terminal of the transistor TR32 is connected inter alia to the source terminal of the transistor TR33. The signal WRITE is fed to the gate terminal of the transistor TR33, and the drain terminal of the transistor TR33 is connected to the node NE. Consequently, the latch (if the sense amplifier output signal and the control signals SELECT and WRITE simultaneously have a high level suitable for activating the transistors TR31 to TR33) can be set, that is to say put into a state storing a bit having the value 1, by means of the transistors TR31 to TR33. The drain terminal of the transistor TR32 is furthermore connected to the source terminal of the transistor TR34. The signal UPD1 is fed to the gate terminal of the transistor TR34, and the drain terminal of the transistor TR33 is connected to the node NA. Consequently, the latch (if the sense amplifier output signal and the control signals SELECT and UPD1 simultaneously have a high level suitable for activating the transistors TR31, TR32 and TR34) can be reset, that is to say put into a state storing a bit having the value 0, by means of the transistors TR31, TR32 and TR34. The signal output by the sense amplifier SAx is furthermore fed to the source terminal of the transistor TR35. The signal SELECT is fed to the gate terminal of the transistor TR35, and the drain terminal of the transistor TR35 is connected inter alia to the source terminal of the transistor TR36. The signal WRITE is fed to the gate terminal of the transistor TR36, and the drain terminal of the transistor TR32 is connected to the node NA. Consequently, the latch (if the control signals SELECT and WRITE simultaneously have a high level suitable for activating the transistors TR35 and TR36) can be set or reset by means of the transistors TR35 and TR36, the fact of whether setting or resetting is effected being dependent on the level of the sense amplifier output signal. The drain terminal of the transistor TR35 is furthermore connected to the source terminal of the transistor TR37. The signal UPD2 is fed to the gate terminal of the transistor TR37, and the drain terminal of the transistor TR37 is connected to the node NE. Consequently, the latch (if the control signals SELECT and UPD2 simultaneously have a high level suitable for activating the transistors TR35 and TR37) can be set or reset by means of the transistors TR35 and TR37, the fact of whether setting or resetting is effected being dependent on the level of the sense amplifier output signal. The node NE is furthermore connected to ground via the transistor TR38. The transistor TR38 is controlled by the signal SET. Consequently, the latch can also be set by the signal SET (if the latter has a high level suitable for activating the transistor TR38). The node NA is furthermore connected to ground via the transistor TR39. The transistor TR39 is controlled by the signal RESET. Consequently, the latch can also be reset by the signal RESET (if the latter has a high level suitable for activating the transistor TR39).

As can be seen from FIG. 7 and the above description, the arrangement shown in FIG. 7 can effect erasure attenuation of excessively intensely erased memory transistors, and also subsequent erasure for excessively weakly erased memory transistors, and also subsequent programming for excessively weakly programmed memory cells. To put it more precisely, the control device CLN can instigate, by means of the control signal WRITE, erasure attenuation, to put it more precisely the performance of steps L3 to L5 and (as required) programming of the excessively intensely erased memory cells, instigate, by means of the control signal UPD2, subsequent erasure of excessively weakly erased memory cells, to put it more precisely the performance of steps NL3 to NL5 and L2, and instigate, by means of the control signal UPD1, subsequent programming of excessively weakly programmed memory cells, to put it more precisely the performance of steps B3 to B5 and B2.

The arrangement in accordance with FIG. 7 is thus a universally usable arrangement for reliable programming and/or erasure of the memory cell array SZF.

The arrangement shown in FIG. 7 moreover also affords possibilities for writing to the page memory PBN independently of the sense amplifier output signal. This is done under the control of the control signal WRITE. The data that are to be written to the page memory are fed to the latter via a multiplexer (not shown in FIG. 7) which is arranged between the sense amplifier SAx and the memory element PBE2x and to which are fed not only the output signal of the sense amplifier but also data from the control device CLN.

Furthermore, setting (=writing 1) and resetting (=writing 0) of the latch formed by the inverters I1 and I2 can be effected via the control lines SET and RESET, respectively.

Moreover, by means of the control line SELECT, the memory element PBE2x can be put into a deselected state in which the data stored in it (in the latch formed by the inverters I1 and I2) are saved against alterations independently of the data, signals and further control signals fed to the memory element.

What is common to the arrangements shown in FIGS. 5 to 7 is that the content of the page memory PBN can be altered in a manner solely dependent on the sense amplifier output signals. This makes it possible to dispense with the combination devices which are present in the conventional arrangement in accordance with FIG. 3 and which combine the sense amplifier output signals with the data that would have to be stored in the memory cells read. For the sake of completeness, it should be noted that the control signals UPD, UPD1, UPD2, SELECT, WRITE, SET and RESET which are fed to the page memory PBN of the arrangements presented here in accordance with FIGS. 5 to 7 alongside the sense amplifier output signals have nothing to do with the data that would have to be stored in the memory cells of the memory cell array. These control signals are signals which serve for controlling the temporal sequence and the configuration of the page memory PBN.

Figure 3:
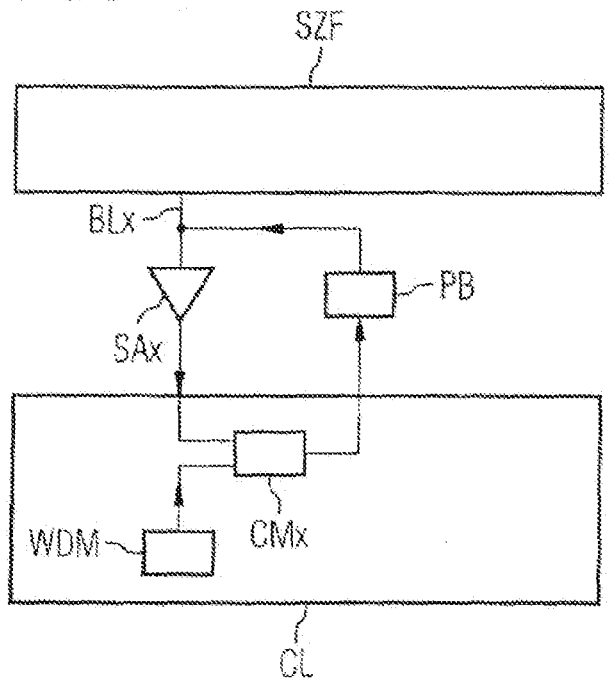
FIG. 3 shows a conventional arrangement for programming a flash memory.

Dispensing with the combination devices present in the conventional arrangement in accordance with FIG. 3, and, accompanying this, the reduction of the number and/or length of the buses to be provided, make it possible for the memory device presented here to be able to be produced considerably smaller and less expensively and, moreover, to have a significantly lower energy requirement. Independently of this, the modification of the page memory content that is presented here can be carried out more rapidly than is the case for instance with the conventional arrangement in accordance with FIG. 3.

Furthermore, the arrangements shown in FIGS. 5 to 7 make it possible to subsequently eliminate not only excessively weak programming but also in addition excessively weak or excessively intense erasure.

As has already been mentioned above, the arrangements shown in FIGS. 5 to 7 can be modified in a wide variety of ways. For the sake of completeness, it should be mentioned that the modification possibilities mentioned are not to be regarded as an exhaustive enumeration of the possible modifications. It should be apparent and needs no further explanation that still further modifications are also possible.

The memory device described above proves to be advantageous independently of the details of the practical realization. It can ensure proper programming and erasure of the memory device with minimal outlay.

List of Reference Symbols

Bx Threshold voltage range
BLx Bit line
CL Control logic
CLN Control logic
CM Combination device
D Drain terminal of T
FG Floating gate of T
G Gate terminal of T
Ix Inverter
NA Connection point between I1 and I2
NE Connection point between I1 and I2
PB Page memory
PBE Memory element of PBN
PBE2 Memory element of PBN
PBE3 Memory element of PBN
PBN Page memory
S Source terminal of T
SAx Sense amplifier
SLx Source line
SRx Memory cell row
SSx Memory cell column
SZF Memory cell array
Tx Memory transistor
TM Conversion device
TRx Transistor
VTx Threshold voltage
WDM Write data memory
WLx Word line

What is claimed is:

1. A method for erasing or programming a nonvolatile memory device for storing data comprising at least one memory cell, at least one sense amplifier for reading out the content of the at least one memory cell, and a page memory for buffer-storing data used as a basis for defining the driving of the at least one memory cell during the erasure or programming, the erasure or programming of a memory cell comprising the following steps of:

performing an erasure or programming operation in a manner dependent on the data stored in the page memory, reading out the content of the erased or programmed memory cells, modifying the content of the page memory in a manner dependent on the data read out, and performing a further erasure or programming operation in a manner dependent on the modified data, and the data read out from the erased or programmed memory cell being fed to the page memory, and the content of the page memory being modified in a manner solely dependent on these data and control signals controlling the temporal sequence.

2. A method according to claim 1, wherein when a memory cell to be programmed has not been programmed sufficiently intensely, single or multiple subsequent programming of this memory cell is effected.

3. A method according to claim 1, wherein when a memory cell to be erased has not been erased sufficiently intensely, single or multiple subsequent erasure of this memory cell is effected.

4. A method according to claim 1, wherein when a memory cell to be erased has been erased excessively intensely, single or multiple programming of this memory cell is effected.

5. A nonvolatile memory device for storing data, comprising:
    at least one memory cell,
    at least one sense amplifier for reading out the content of the at least one memory cell,
    a page memory for buffer-storing data used as a basis for defining the driving of the at least one memory cell during the erasure or programming, and
    a control device for controlling the erasure or programming of the at least one memory cell,
    the control device for erasing or programming the at least one memory cell being operable to perform of the following steps of:
    performing a first erasure or programming operation in a manner dependent on the data stored in the page memory,
    reading out the content of the erased or programmed memory cells,
    modifying the content of the page memory in a manner dependent on the data read out, and
    performing a further erasure or programming operation in a manner dependent on the modified data, and
    the at least one sense amplifier having a connection to the page memory via which the data read out from the erased or programmed memory cell by the sense amplifier are fed to the page memory, and
    the content of the page memory being modified in a manner solely dependent on these data and control signals controlling the temporal sequence.

6. A nonvolatile memory device according to claim 5, wherein the page memory contains at least one memory element, each memory element containing a buffer memory for storing a data bit and a transistor, the source terminal of which is connected to the output terminal of the sense amplifier, the drain terminal of which is connected to the buffer memory directly or via further components of the memory element, and to the gate terminal of which is applied a control signal which is output by the control device and controls the temporal sequence.

7. A nonvolatile memory device according to claim 5, wherein the page memory contains at least one memory element, each memory element containing a buffer memory for storing a data bit and two series-connected transistors, a constant voltage being applied to the source terminal of the first transistor, the drain terminal of the first transistor being connected to the source terminal of the second transistor, the drain terminal of the second transistor being connected to the buffer memory directly or via further components of the memory element, and, of the gate terminals of the first transistor and of the second transistor, the gate terminal of one transistor is connected to the output terminal of the sense amplifier and the gate terminal of the other transistor has applied to it a control signal which is output by the control device and controls the temporal sequence.

8. A nonvolatile memory device according to claim 5, wherein the buffer memory is formed by two inverters reverse-connected in parallel.

9. A nonvolatile memory device for storing data comprising:
    a memory cell,
    a sense amplifier for reading out the content of the memory cell,
    a page memory for buffer-storing data used as a basis for defining the driving of the memory cell during the erasure or programming,
    means for performing an erasure or programming operation in a manner dependent on the data stored in the page memory,
    means for reading out the content of the erased or programmed memory cells,
    means for modifying the content of the page memory in a manner dependent on the data read out, and
    means for performing a further erasure or programming operation in a manner dependent on the modified data, wherein the data read out from the erased or programmed memory cell being fed to the page memory, and the content of the page memory being modified in a manner solely dependent on these data and control signals controlling the temporal sequence.

10. A device according to claim 9, wherein the device is operable in such a way that when a memory cell to be programmed has not been programmed sufficiently intensely, single or multiple subsequent programming of this memory cell is effected.

11. A device according to claim 9, wherein the device is operable in such a way that when a memory cell to be erased has not been erased sufficiently intensely, single or multiple subsequent erasure of this memory cell is effected.

12. A device according to claim 9, wherein the device is operable in such a way that when a memory cell to be erased has been erased excessively intensely, single or multiple programming of this memory cell is effected.

* * * * *

UNITED STATES PATENT AND TRADEMARK OFFICE
CERTIFICATE OF CORRECTION

PATENT NO. : 7,274,595 B2  Page 1 of 1
APPLICATION NO. : 11/318865
DATED : September 25, 2007
INVENTOR(S) : Christoph Deml et al.

It is certified that error appears in the above-identified patent and that said Letters Patent is hereby corrected as shown below:

Column 16, line 36: Please replace the wording "L3 to L5" with the wording --LA3 to LA5--
Column 17, line 39: Please replace the phrase "L5" with the phrase --LA5--
Column 17, line 49: Please replace the wording "L3 to L5" with the wording --LA3 to LA5--
Column 19, lines 13-14: Please replace the wording "L3 to L5" with the wording --LA3 to LA5--
Column 19, line 18: Please replace the phrase "L3" with the phrase --LA3--
Column 20, line 17: Please replace the phrase "L5" with the phrase --LA5--
Column 20, line 27: Please replace the wording "L3 to L5" with the wording --LA3 to LA5--
Column 25, line 7: Please replace the wording "L3 to L5" with the wording --LA3 to LA5--

Signed and Sealed this

Fifteenth Day of January, 2008

JON W. DUDAS
*Director of the United States Patent and Trademark Office*